United States Patent [19]

Kauffmann et al.

[11] Patent Number: 4,729,115
[45] Date of Patent: Mar. 1, 1988

[54] NON-VOLATILE DYNAMIC RANDOM ACCESS MEMORY CELL

[75] Inventors: Bruce A. Kauffmann, Jericho, Vt.; Chung H. Lam, Troy, N.Y.

[73] Assignee: International Business Machines Corporation, Armonk, N.Y.

[21] Appl. No.: 655,134

[22] Filed: Sep. 27, 1984

[51] Int. Cl.[4] ............................................. G11C 11/40
[52] U.S. Cl. .................................................... 365/185
[58] Field of Search .......................................... 365/185

[56] References Cited

U.S. PATENT DOCUMENTS

| | | | |
|---|---|---|---|
| 3,825,946 | 7/1974 | Frohman-Bentchkowsky | 365/185 |
| 3,906,296 | 9/1975 | Maserjian et al. | 365/185 |
| 4,099,196 | 7/1978 | Simko | 357/23 |
| 4,104,675 | 8/1978 | DiMaria . | |
| 4,119,995 | 10/1978 | Simko | 357/23 |
| 4,274,012 | 1/1979 | Simko | 307/238.3 |
| 4,300,212 | 10/1981 | Simko | 365/185 |
| 4,314,265 | 2/1982 | Simko | 357/23 |
| 4,334,292 | 6/1982 | Kotecha | 365/182 |
| 4,336,603 | 6/1982 | Kotecha et al. | 365/182 |
| 4,363,110 | 12/1982 | Kalter et al. | 365/149 |
| 4,375,085 | 2/1983 | Grise et al. | 365/104 |
| 4,380,057 | 4/1983 | Kotecha et al. | 365/185 |
| 4,399,522 | 8/1983 | Kotecha | 365/185 |
| 4,432,072 | 2/1984 | Chao et al. | 365/149 |
| 4,446,535 | 5/1984 | Gaffney et al. | 365/149 |
| 4,449,205 | 5/1984 | Hoffman | 365/182 |

OTHER PUBLICATIONS

Lee, "A New Approach for a Floating-Gate MOS Non-Volatile Memory", *Applied Phy. Letters,* vol. 31, No. 7, 10/77, pp. 475-476.

Hoffman, "Floating Gate Non-Volatile Memory Cell", *IBM Technical Bulletin,* vol. 22, No. 6, Nov. 1979, pp. 2403-2404.

*Primary Examiner*—James W. Moffitt
*Attorney, Agent, or Firm*—Mark F. Chadurjian

[57] ABSTRACT

A non-volatile dynamic memory cell in which the non-volatile element has two different areas for electron injection, such that direct overwriting of previously stored non-volatile data is permitted without an intervening erase cycle. The non-volatile storage element is a floating gate electrode which has dual control gates disposed thereon. Each control gate includes a layer of dual electron injector structure (DEIS) and a polysilicon gate. When writing a "0" from the volatile storage capacitor to the floating gate, one of the control gates removes charge from the floating gate. To write a "1", the other control gate injects charge into the floating gate. The above charge transfer does not take place if the previously stored logic state and the logic state to be written in are identical. In order to minimize the adverse effects of process variations, the gate electrode of the word line device is electrically in common with one of the control gates.

19 Claims, 6 Drawing Figures

NON-VOLATILE DYNAMIC RANDOM ACCESS MEMORY CELL

DESCRIPTION

1. Technical Field of the Invention

The invention relates to the field non-volatile dynamic random access memory cells.

2. Cross Reference to Related Applications

Reference is made to co-pending U.S. patent applications Ser. No. 655,175, J. P. Kasold et al, "Dual Gate EEPROM Cell", and Ser. No. 655,176, C. H. Lam, "Non-Volatile Dynamic Random Access Memory Cell", filed Sept. 27, 1984 and assigned to the assignee of the present invention, now U.S. Pat. No. 4,665,417.

3. Background Art

Non-volatile floating-gate MOS memories are well known in the industry. In such devices, the conductive state of an FET is determined by the voltage on an associated floating gate.

Designs have been proposed which facilitate the erasure and resetting of the voltages on these floating gates. For example, in U.S. Pat. No. 4,119,995 (issued Oct. 10, 1978 to Simko and assigned to Intel Corporation) the floating gate is controlled by separate programming and erasure gates which are disposed above the floating gate and insulated therefrom by an oxide layer. The floating gate voltage is programmed by electron injection from the substrate. The charge on the floating gate is erased by causing electrons to flow from the floating gate up to the erasing gate.

Other designs have been proposed which utilize charge transfer between the floating gate and one or more control gates to both erase and program the floating gate (i.e., in these designs the tunnelling or avalanche of electrons from a structure other than a substrate region is used to set the voltage of the floating gate). See e.g. Lee, "A New Approach for the Floating-Gate MOS Nonvolatile Memory", *Applied Physics Letters*, Vol. 31, No. 7, October 1977, pp. 475–476. This paper discloses a single control gate separated from the floating gate by a poly-oxide layer. When the control gate is biased positive for writing, electron flow is induced from the floating gate to the control gate. Since this flow is greater than the flow of electrons from the substrate to the floating gate, the floating gate accumulates positive charge. When the control gate is ramped negative to erase, the floating gate accumulates negative charge. See also U.S. Pat. Nos. 4,099,196; 4,274,012; 4,300,212; and 4,314,265 (issued July 4, 1978, Jan. 24, 1979, Oct. 10, 1981 and Feb. 2, 1982, respectively, to Simko) which disclose erasable PROM's wherein a programming gate is disposed below the floating gate and an erasure gate is disposed above the floating gate. The devices are programmed by inducing electron flow from the program gate to the control gate and are erased by inducing electron flow from the floating gate to the erasing gate. In all four patents, the surface of one or more of the gates is roughened in order to enhance the induced electric fields. This promotes electron flow through the oxide layers separating the gates.

Among the materials which have such charge injection properties is the so-called dual electron injector structure (DEIS), which is a layer of $SiO_2$ having excess silicon crystals on its upper and lower surfaces. This structure is disclosed in U.S. Pat. No. 4,104,675 (issued to DiMaria and assigned to the assignee of the present application). A DEIS layer is generally formed by a chemical vapor deposition process which induces extra silicon crystal growth both prior and subsequent to the formation of an otherwise normal $SiO_2$ layer. Several patents specifically disclose the use of a DEIS layer as the injector structure for a non-volatile memory. See e.g., U.S. Pat. No. 4,336,603 (issued June 22, 1982 and assigned to the assignee of the present application). This patent discloses a single control gate which injects electrons into the floating gate through a DEIS layer.

This DEIS layer has also been incorporated in providing the injector structure for the non-volatile component of a non-volatile dynamic RAM. See e.g. U.S. Pat. No. 4,446,535 (issued May 1, 1984 to Gaffney et al and assigned to the assignee of the present application), which discloses the use of DEIS to construct a single control gate of a non-volatile element associated with (i.e. storing the "latent image" of) a dynamic RAM cell (DRAM). Such non-volatile DRAMs are also disclosed in U.S. Pat. Nos. 4,449,205 (issued May 15, 1984 to Hoffman); 4,363,110 (issued Dec. 7, 1982 to Kalter et al); 4,432,072 (issued Feb. 14, 1984 to Chao et al) and 4,375,085 (issued Feb. 22, 1983 to Grise et al), all of which are assigned to the assignee of the present application. In each of these patents, the data stored on the floating gate is erased before new data can be stored thereon. This extra operational step adversely affects the operational speeds attainable in these memories.

SUMMARY OF THE INVENTION

It is an object of the present invention to provide an improved non-volatile dynamic random access memory cell.

It is another object of the invention to provide a non-volatile dynamic memory cell in which data can be written into the cell without first erasing the existing data stored thereon.

It is yet another object of the invention to provide a non-volatile dynamic RAM cell which needs a minimum of support circuitry.

It is yet another object of the invention to provide a non-volatile dynamic RAM cell which can be combined with other such cells to form a high density memory array.

It is a further object of the invention to construct such a non-volatile dynamic RAM cell such that it is more immune to degradations in performance due to misalignment of the polysilicon layers.

These and other objects of the invention are realized by a non-volatile dynamic RAM cell in which the word line electrode is coupled through a layer of DEIS material to a floating gate. The floating gate is also coupled to a control gate electrode through a separate layer of DEIS material. These layers are configured such that the respective capacitance of the cell are not adversely affected by process variations.

In operation, when a first binary logic state is written into the floating gate from the storage capacitor, the DEIS material induces electron flow from the floating gate to the control gate. When a second binary logic state is written into the floating gate, the DEIS material induces charge injection from the plate of the capacitor into the floating gate. Due to the characteristics of the DEIS layer, the above-described charge transfers will occur if the logic state to be written is the opposite of the logic state already stored on the floating gate. No charge transfer will occur if these logic states are the same. Hence, there is no need for an erasure step prior to writing in given logic state into the non-volatile portion of the non-volatile dynamic RAM of the invention.

BRIEF DESCRIPTION OF THE DRAWINGS

The foregoing and other objects, features and advantages of the present invention will become more apparent upon a detailed description of the best mode for carrying out the invention. In the description to follow, reference will be made to the accompanying drawings, in which.

BEST MODE FOR CARRYING OUT THE INVENTION

Figure 1:
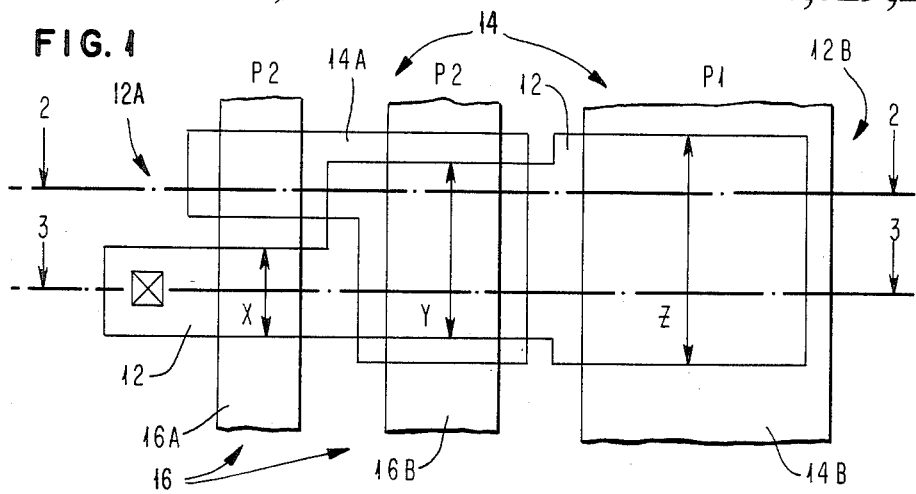
FIG. 1 is a top view of the memory cell of the invention.
Figure 2:
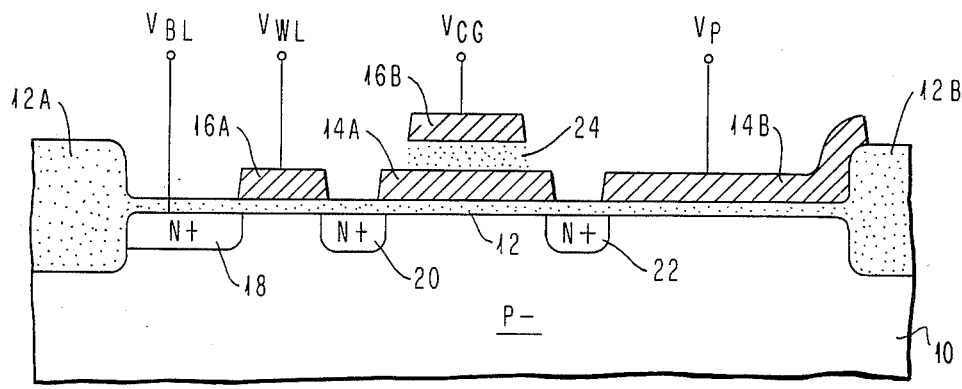
FIG. 2 is a cross-sectional view of the memory cell along line 3—3 of FIG. 1.
Figure 3:
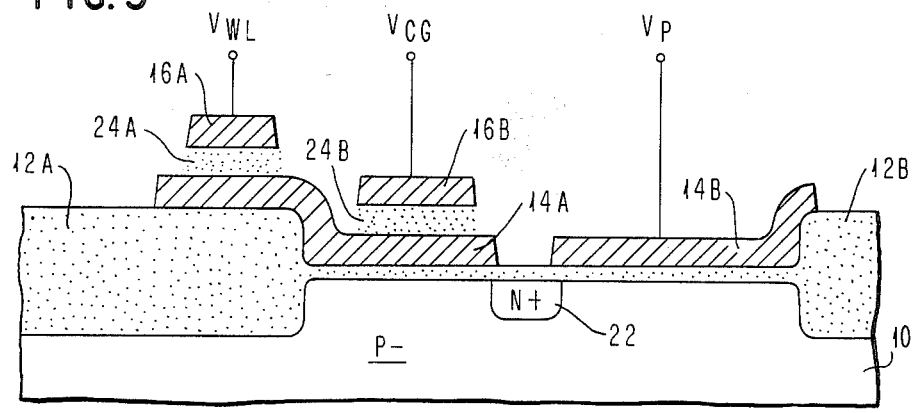
FIG. 3 is a cross-sectional view of the memory cell along line 2—2 of FIG. 1.

With reference to FIGS. 1-3, the structure of the memory cell will be described. FIG. 1 is a top view of the various layers deposited on a p-type (or n-type) semiconductor substrate 10. An $SiO_2$ insulator layer 12 is grown on the substrate. The insulator layer includes semi-recessed oxide isolation (S-ROX) regions 12A and 12B, which surround insulator layer 12 as shown more clearly in FIGS. 2 and 3. Note that insulator layer 12 is etched such that it has three discrete widths x, y and z in the horizontal direction (i.e. in a direction parallel to the plane of the substrate). A first polycrystalline silicon layer 14 is deposited on the insulator layer 12, and is etched to form two discrete portions 14A and 14B. Portion 14A (which is a floating gate electrode) substantially overlaps the region of insulator 12 having an intermediate width y, and partially extends into an area of the substrate covered by S-ROX region 12A (i.e. an area of the substrate which is covered by the insulator region having the smallest width x). Portion 14B (which is the plate of the storage capacitor) substantially overlaps the region of insulator 12 having the largest width z.

After the formation of a DEIS layer on the surface of portion 14A (as will be discussed hereafter), a second layer of polycrystalline silicon 16 is then deposited on the substrate 10. The second layer of polysilicon is etched to form two discrete portions 16A and 16B. Note that portion 16A substantially overlaps that region of portion 14A which overlays S-ROX region 12A. Portion 16B substantially overlaps the remainder of portion 14A. This particular configuration maximizes the overlap between the floating gate electrode 14A and the second polysilicon layer 16A to thus minimize the adverse effects of any alignment variation during processing.

FIG. 2 shows a cross-sectional view of the memory cell of FIG. 1 taken along line 3—3. After the deposition and etching of second polysilicon layer 16, n-type diffusions 18, 20 and 22 are formed in substrate 10 using typical implantation techniques. Diffusion 18 is a diffused bit line which receives a control voltage $V_{BL}$. Diffusions 20 and 22 serve to separate the respective polysilicon layers from one another. As previously mentioned, the first and second polysilicon layers are separated by a layer of DEIS material 24. With reference to FIG. 3, note that the DEIS layer 24 is etched along with polysilicon layer 16 to form discrete portions 24A and 24B underlying the gate electrode 16A of the word line device (referred to hereafter as "word line electrode 16A") and the control gate electrode 16B, respectively, to form first and second control gates which supply charge to and remove charge from the floating gate 14A. The word line electrode 16A receives a control voltage $V_{WL}$ and acts as an FET in transferring the bit line voltage to the memory cell as well as controlling the voltage on the floating gate. The control gate electrode 16B receives a voltage $V_{CG}$ for controlling the voltage state of floating gate 14A. Finally, the capacitor plate 14B receives a control voltage $V_P$ for controlling the voltage on the storage node (i.e. the region of the substrate beneath 14B).

Figure 4A:
FIGS. 4A and 4B are diagrams illustrating the conductive characteristics of the DEIS layer.
Figure 4B:
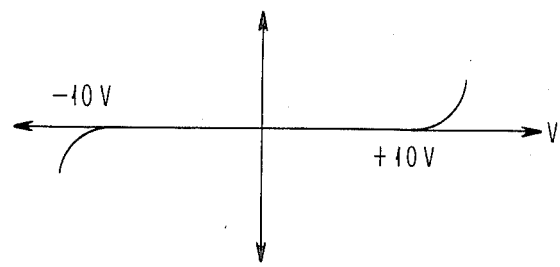

Prior to discussing the operation of the cell, the characteristic of the DEIS layer will now be reviewed. Due to the electron flow enhancement properties of the surfaces of the DEIS layer with respect to the inner $SiO_2$, each surface of the DEIS layer has an inherent diode characteristic. Since the respective surfaces of the DEIS layer promote electron flow in different directions, the total DEIS layer acts as (i.e. provides the electrical characteristic of) two back-to-back connected diodes, as shown in FIG. 4A. As shown in FIG. 4B, it is preferred that the DEIS layer be formed such that these diodes begin conduction at approximately $\pm 10$ volts. It is to be appreciated that any charge injecting material providing the characteristic as shown in FIG. 4B could be substituted for the DEIS material.

The operation of the invention will now be described with reference to FIG. 5, which shows an equivalent circuit of the cell of FIG. 1. Switch S1 represents the word line FET, which switches $V_{BL}$ onto the substrate when $V_{WL}$ goes to +5 volts. $C_{D1}$ is the capacitance formed by DEIS region 24B between control gate electrode 16B and floating gate 14A; $C_{D2}$ is the capacitance formed by DEIS region 24A between the word line electrode 16A and floating gate 14A; $C_{FGN}$ is the capacitance formed by insulator layer 12 between floating gate 14A and the substrate 10; $C_I$ is an additional inversion capacitance formed between the floating gate 14A and the substrate 10 only when a well region is induced beneath floating gate 14A; and $C_S$ is the storage capacitor. For the sake of clarity, the various parasitic capacitances inherent in the memory cell have been deleted from the equivalent circuit of FIG. 5. This equivalent circuit has been found to present an accurate first order approximation of the performance of the memory cell.

Prior to describing the non-volatile aspects of the operation of the memory cell of the invention, a brief discussion will now be made of its function as a dynamic memory device. To write volatile data into the cell, $V_P$ is set at +5 volts. The control gate voltage $V_{CG}$ is set at +8 volts, which causes the floating gate voltage $V_{FG}$ to rise to +5 volts (due to the respective capacitive values of $C_{D1}$, $C_{D2}$ and $C_{FGN}$, as will be discussed in more detail later). After the voltage on the floating gate has stabilized, $V_{WL}$ is ramped up to +5 volts, causing the bit line voltage to be transferred via the word line device to the storage capacitor $C_S$. If $V_{BL}=0$ volts, the storage capacitor will be grounded and will thus store a "0" logic state; if $V_{BL}=+5$ volts, $C_S$ will charge to +5 volts minus Vt (the threshold of the word line device) and will thus store as "1" logic state. To read the cell, the bit line is precharged to +5 V, $V_{WL}$ is again ramped to 30 5 volts, and the bit line current is sensed. If the storage capacitor is storing a "0", the capacitor will charge and hence the bit line current will drop. If the capacitor is storing a "1", there will not be any bit line current drop. Thus, the surface of the substrate beneath the floating gate and the capacitive plate functions as a dynamic storage node during volatile operations.

Figure 5:
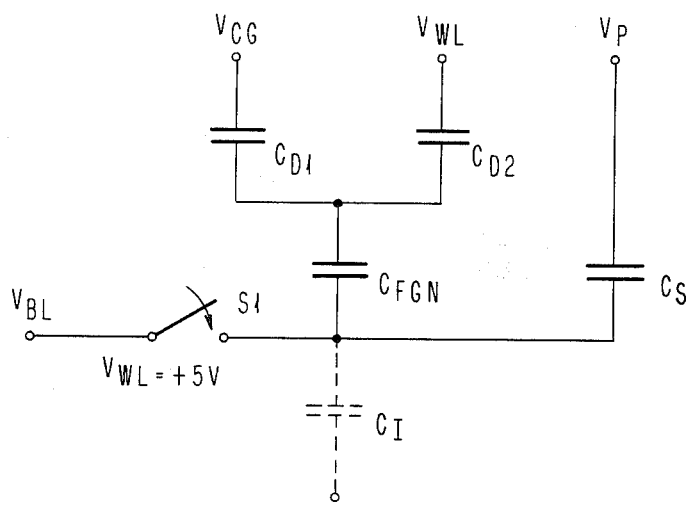
FIG. 5 is an equivalent circuit of the memory cell of the invention.

The relationships between the capacitances of the capacitors shown in FIG. 5 is as follows:

$C_{D1} \approx \frac{1}{4} C_{FGN}$ $C_{D2} \approx \frac{1}{4} C_{D1}$ $C_I \approx 0.1 C_{FGN}$ $C_S > C_{FGN}$ These general relationships govern the operation of the cell by controlling the charge transfer through DEIS regions 24A and 24B, as will be discussed in more detail below.

The operation of the cell will now be discussed for "SAVE" and "GET" operations. The "SAVE" operation causes each of the floating gates of the memory array to store the logic states on its associated storage capacitor. The "GET" operation causes all of the floating gates to transfer its stored logic state to its associated storage capacitor. This enables the memory array to be written into and read from in the same manner as conventional dynamic storage cells (since these operations are carried out with respect to the storage capacitor and not the floating gate). It is important to note that both of these operations are non-destructive with respect to the transferor (e.g. after the "SAVE" operation the capacitor still retains its stored logic state).

To perform the "SAVE" operation, $V_{WL}$ is forced to ground, $V_{BL}$ is set at +5 volts and the voltage on the control gate electrode is raised from +8.5 volts to +20 volts. After $V_{CG}=20$ V, the voltage $V_P$ on the capacitor plate is lowered to ground. As a consequence, the potential well beneath floating gate 14A increases, and the potential well beneath capacitor plate 14B decreases. If the capacitor is storing a "0" state (i.e. no charge being stored), the inversion layer beneath the capacitor plate has its normal complement of electrons. Thus, when the potential well beneath the capacitor decreases in size, electrons will be forced to flow from beneath the capacitor plate to the larger potential well beneath the floating gate. This causes the surface of the substrate beneath the floating gate to become more negatively charged, capacitively coupling the floating gate voltage $V_{FG}$ towards ground potential. If the capacitor is storing a "1" state (i.e. +5 V charge storage), the inversion layer beneath the plate is depleted of free electrons. No charge transfer to th potential well beneath the floating gate takes place, allowing the floating gate voltage to vary with the control gate voltage (which is at a high level).

In general, the voltage on the floating gate can be expressed as $$V_{FG} = \chi V_{CG}, \quad (1)$$

where $\chi$ is the capacitor coupling ratio. When a "0" is to be stored, $V_{CG}=+20$ V, $V_P=0$ V and $V_{sub}=0$ V, such that $$\chi_{"0"} = (C_{D1}/C_{FGT"0"}) \quad (2)$$

where $$C_{FGT"0"} \approx C_{D1} + C_{D2} + C_{FGN} \quad (3)$$

Assume that $\chi_{"0"} \approx 0.3$. Thus $V_{FG}=(0.3)(20)=+6.0$ volts. Now referring back to FIG. 4B, we see that the DEIS material will conduct where the difference between either $V_{CG}$ or $V_{WL}$ and $V_{FG}$ is greater than 10 volts. In this situation, $V_{CG}-V_{FG}=20-6=14$ volts. Thus, DEIS region 24B associated with control gate electrode 16B will conduct, removing charge from floating gate 14A and injecting the charge into control gate electrode 16B. This charge transfer will continue until the voltage on the floating gate rises from +6.0 V to 10 volts. The net charge gain by the floating gate can be expressed as $$Q_{FG} = (V_{FGf} - V_{FGi}) C_{FGT"0"} \quad (4)$$

where $V_{FGi}=+6$ V and $V_{FGf}=+10$ V. Thus, the potential due to the floating gate charge is $Q_{FG"0"}/C_{FGT}=+4$ V, where $C_{FGT}=C_{FGT"0"}$.

If a "1" is to be stored, recall that the inversion layer beneath the floating gate is floating due to a lack of electron flow from the inversion layer of the storage capacitor. This creates a depletion capacitance $C_I$ between the floating gate capacitor $C_{FGN}$ and the substrate. Thus, $$\chi_{"1"} \approx \frac{C_{D1}}{C_{FGT"1"}}, \quad (5)$$

where $$C_{FGT"1"} = C_{D1} + C_{D2} + \frac{(C_{FGN})(C_I)}{C_{FGN} + C_I} \quad (6)$$

Assuming $\chi_{"1"} \approx 0.7$, $V_{FG}=(0.7)(20)=+14$ volts. Thus, with reference to FIG. 4B, it is apparent that $-4.0$ volts of charge will be injected into the floating gate the word line electrode 16A via DEIS region 24A. Again, the net charge gain by the floating gate $Q_{FG}=(V_{FGf}-V_{FGi})C_{FGT"1"}$, and the potential due to this charge is $Q_{FG}/C_{FGT}=-4$ V, where $C_{FGT}=C_{FGT"1"}$.

Thus, the non-volatile portion of the memory cell of the invention will acquire a +4 V charge when the storage capacitor stores a "0" state, and will acquire a $-4$ V charge when the storage capacitor stores a "1" state.

A feature of disclosed memory cell is that the dynamically stored data can be read (by the coupling of the data signals to the storage capacitor) without concern that the negatively charged floating gate will impede channel formation. As discussed above, the charge on the floating gate is $-4$ V when storing a "1" state. This high negative charge may be sufficient to at least partially decouple the voltage developed on the bit line from the storage capacitor by prohibiting channel formation. However, when we want to "read" the logic state stored on the capacitor and the floating gate stores a "1", the depletion capacitance $C_I$ will be removed since the inversion layer beneath the floating gate no longer floats (i.e. it is receiving electrons from the word line device). As a result, the voltage due to the stored charge will drop from $-4$ V $(=Q_{FG}/C_{FGT"1"})$ to $-1.8$ V $(=Q_{FG}/C_{FGT"0"})$, and thus the floating gate will not impede channel formation to a degree which would prevent a proper "read" cycle.

The foregoing description of the non-volatile operation of the cell was made with the assumption that the floating gate was devoid of charge when the writing operation was initiated. A feature of the invention is that new data can be written over the old data stored on the floating gate without the need for an intervening erasure of the old data. This feature will now be discussed in more detail. During the discussion, reference will be made to the following relationship:

$$V_{FGN} = V_{FGO} + V_{FGW}$$

where $V_{FGN}$ = the new voltage of the floating gate at the end of the present writing step;

$V_{FGW}$ = the voltage on the floating gate at the end of the present writing step, assuming no previous floating gate charge; and $V_{FGO}$ = the voltage on the floating gate due to the previous charge storage from an immediately preceding writing step.

(a) Cell at "0" state, write in a "0":

Under these circumstances, the voltage on the floating gate $V_{FGN} = (+6 \text{ V}) + (+4 \text{ V}) = +10$ volts. That is, assuming no previous charge storage, the floating gate will be at +6 volts when storing a "0"; furthermore, due to the charge transfer in storing a prior "0", the floating gate already has +4.0 volts of charge stored thereon. Therefore, since the floating gate is at +10 volts, there will not be any charge injection, and the voltage on the floating gate will still be +4 volts.

(b) Cell at "1" state, write in a "0":

Here, $V_{FGN} = (-4 \text{ V}) + (+6 \text{ V}) = +2 \text{ V}$ The −4.0 volts is due to the charge injected on the floating gate in storing a "1" previously, and the +6 V is the voltage on the floating gate due to the present writing of a "0". Thus, there will be +8 volts worth of charge removal from the floating gate to control gate electrode 16B, and the final voltage of the floating gate will be $V_{FG} = (-4 \text{ V}) + (+8 \text{ V}) = +4 \text{ V}$.

(c) Cell at "0" state, write in a "1":

Initially, $V_{FGN} = (+4 \text{ V}) + (+14 \text{ V}) = +18$ volts, such that −8 V worth of charge will be injected into the floating gate, such that $V_{FG} = (+4 \text{ V}) + (-8 \text{ V}) = -4$ volts.

(d) Cell at "1" state, write in a "1":

$V_{FGN} = (-4 \text{ V}) + (+14 \text{ V}) = +10$ volts, such that no charge injection occurs and $V_{FG}$ still = −4 V.

Once the above-described "SAVE" operation has been completed, the charge on the floating gate is indicative of the logic state on the storage capacitor. Since the charge stored on the capacitor is no longer important, the memory array does not have to be periodically refreshed. In order to read the cell by conventional DRAM techniques, the charge stored on the floating gate must now be transferred back to the storage capacitor. In this "GET" operation, a "1" is first written into all of the cells of the array by raising the bit line voltage $V_{BL}$ to +5 volts and then raising the word line voltage $V_{WL}$ to +5 volts, while keeping $V_{CG} = 8.5$ V and $V_P$ at +5 volts. As a result, the storage capacitor will be charged to $+5 \text{ V} - V_T$ of the word line device. Note that this step can be completed concurrently with a conventional DRAM refresh cycle by forcing the bit line to +5 V.

Then, the control gate electrode 16B is grounded ($V_{CG} = 0$), the bit line is grounded ($V_{BL} = 0$), and then the word line electrode 16A is raised to +5 volts. The floating gate potential is due only to the charge stored on the floating gate. If the floating gate is positively charged (i.e. storing a "0" state), a channel will be induced below the floating gate, and the voltage of the inversion layer beneath the capacitor will be forced to the bit line voltage (i.e. ground). Hence, for a "0" stored on the floating gate, the capacitor voltage is at ground after the "GET" operation. On the other hand, for a stored "1", the negative charge on the floating gate will prohibit channel formation, and hence the inversion layer of the capacitor will remain at +5 volts after the "GET" operation. Again, this step can be concurrent with a conventional DRAM refresh cycle by forcing the bit line to OV.

The non-volatile dynamic memory of the invention can be implemented with a minimum of support circuitry, in that only one control voltage ($V_{CG}$) rises above $V_{DD} = +5$ volts. Moreover, the memory cell of the invention is of relatively simple construction, and hence does not require a large number of processing steps in order to construct.

Further, the non-volatile portion of the memory cell has an overwrite capability. That is, new data can be written into the floating gate without first erasing the previously stored logic state. This elimination of the intervening erase step improves the overall storage cycle time of the cell.

Finally, the arrangement of the insulator layer as well as the first and second polysilicon layers minimizes the adverse effects of process variations. More specifically, in order for the memory cell of the invention to function properly, the relationships between the capacitors (e.g. $C_{D2} = \frac{1}{3} C_{D1}$) must be maintained. The particular arrangement of first poly 14A and second poly 16A (i.e. having the word line electrode serve as the control electrode of one of the control gates overlaying the floating gate) minimizes the possibility of disturbing these relationships should an error in the manufacturing process cause the two poly layers to be displaced with respect to one another.

It is to be understood that modifications can be made to the best mode for carrying out the invention as described above without departing from the spirit and scope of the invention.

What is claimed is:

1. A non-volatile dynamic memory cell, comprising:
   a semiconductor substrate of a first conductivity type having a first region which functions as a dynamic storage node for storing first and second logic states, a second region of a second conductivity type, and a third region disposed between said first and second regions;
   a transfer device for selectively coupling data signals between said second region and said first region, said transfer device having a control electrode;
   a floating gate electrode disposed above and insulated from said third region;
   first and second charge injection means disposed on said floating gate electrode for injecting charge into and removing charge from, respectively, said floating gate electrode; and
   first and second control electrodes disposed on said first and second charge injection means, respectively, said first and second control electrodes receiving first and second control signals, respectively, said first and second control electrodes initiating said charge transfer by said first and second charge injection means, respectively, as a function of the voltage on said first region, said logic states being overwritten into said floating gate electrode, one of said control electrodes being connected to said control electrode of said transfer device.

2. The memory cell as as recited in claim 1, wherein said second region comprises a diffused bit line.

3. The memory cell as recited in claim 2, wherein said transfer device comprises a word line device, wherein said control electrode of said transfer device comprises a gate electrode of said word line device, and wherein said diffused bit line comprises a drain electrode of said word line device.

4. The memory cell is recited in claim 1, wherein said floating gate electrode is comprised of a first layer of polycrystalline silicon, and wherein said first and second control electrodes are comprised of a second layer of polycrystalline silicon.

5. The memory cell is recited in claim 3, wherein said gate electrode of said word line device is comprised of a second layer of polycrystalline silicon.

6. The memory cell as recited in claim 1, wherein each of said first and second charge injector means has an electrical characteristic analogous to that of two back-to-back connected diodes.

7. The memory cell as recited in claim 6, wherein each of said first and second charge injector means is comprised of a layer of DEIS material.

8. The memory cell as recited in claim 1, further comprising a storage plate electrode disposed on and insulated from said semiconductor substrate, said storage plate electrode at least partially overlaying said first region.

9. A memory cell for storing data in volatile and non-volatile forms, the non-volatile storage having an overwrite capability, comprising:
a semiconductor substrate of a first conductivity type having a first surface region which comprises a dynamic storage node, a second surface region of a second conductivity type which comprises a diffused bit line, and a third region disposed between said first and second regions;
a transfer device having a gate electrode disposed above and insulated from said semiconductor substrate, said transfer device selectively coupling data signals between said second region and said first region to control the voltage of said first region;
a non-volatile storage means disposed above said third region and being insulated therefrom; and
first and second control gates disposed on said non-volatile storage means and receiving first and second control signals, respectively, said first control gate removing charge from said non-volatile storage means when said first region of said substrate is storing a first voltage indicative of a first logic state, and said second control gate injecting charge into said non-volatile storage means when said first region of said substrate is storing a second voltage indicative of a second logic state, said logic states being overwritten from said dynamic storage means into said floating gate electrode;
one of said control gates having a control electrode connected to said gate electrode.

10. The memory cell as recited in claim 9, further comprising a storage plate electrode disposed on and insulated from said semiconductor substrate, said storage plate electrode at least partially overlaying said first region.

11. The memory cell as recited in claim 10, wherein each of said first and second control gates comprises a layer of charge injector material formed on said non-volatile storage means and a layer of polysilicon overlaying said charge injector material.

12. The memory cell as recited in claim 11, wherein said layer of charge injector material comprises a layer of DEIS material.

13. A semiconductor memory cell capable of storing data in non-volatile and dynamic forms, comprising;
a transfer device for selectively coupling data signals between a data line and a dynamic storage node on the surface of a semiconductor substrate, said transfer device having a gate electrode and source and drain electrodes;
a floating gate electrode insulated from and overlying a portion of said semiconductor substrate between said transfer device and said dynamic storage node;
first and second charge injection means overlying first and second portions of said floating gate electrode for injecting charge into and removing charge from, respectively, said floating gate electrode;
first and second control electrodes disposed on said first and second charge injection means, respectively, for writing new data from said dynamic storage node into said floating gate electrode by initiating charge transfer between one or the other of said first and second charge injection means and said floating gate electrode in response to (a) independent control signals received by said first and second control electrodes, respectively, and (b) previously stored charge on said floating gate electrode, said new data being overwritten into said floating gate electrode,
one of said control electrodes being connected to said gate electrode of said transfer device.

14. The memory cell as recited in claim 13, wherein said data line comprises a diffused bit line, said diffused bit line comprising said drain electrode of said transfer device.

15. The memory cell as recited in claim 13, further comprising a storage capacitor plate insulated from and overlaying said dynamic storage node.

16. The memory cell as recited in claim 13, wherein said first and second charge injection means comprises a layer of DEIS material which has been etched to form two separate regions therefor.

17. A semiconductor memory cell capable of storing binary data in volatile and non-volatile forms, comprising:
a storage capacitor comprising a semiconductor substrate having a dynamic storage node for storing first and second binary logic states on a surface thereof and a storage capacitor plate formed above and insulated from said dynamic storage node;
a word line device having a gate electrode formed on said surface of said semiconductor substrate for coupling data signals a between a data line formed on said surface of said substrate and said dynamic storage node;
a floating gate electrode formed above and insulated from a portion of said surface of said semiconductor substrate between said storage capacitor and said word line device;

first and second charge injection means formed on separate regions of said floating gate electrode, said first and second charge injection means being capable of injecting charge into and removing charge from said floating gate electrode; and first and second control electrodes disposed on said first and second charge injection means, respectively, said first and second control electrodes receiving first and second control signals, respectively, such that said first charge injection means removes charge from said floating gate electrode of said word line device when a first binary logic state is to be stored by said floating gate electrode and said second charge injection means injects charge into said floating gate electrode when a second logic state is to be stored by said floating gate electrode, said charge removal or charge injection also being a function of the binary logic state currently stored by said floating gate electrode, such that said binary logic states may be overwritten into said floating gate electrode, said second control electrode comprising a portion of said gate electrode.

18. The memory cell as recited in claim 17, wherein each of said first and second charge injector means has an electrical characteristic analogous to that of two back-to-back connected diodes.

19. A memory cell storing logic data in volatile and non-volatile forms, the non-volatile storage having an overwrite capability, comprising:

a storage capacitor comprising a semiconductor substrate having a dynamic storage node on a surface thereof and a storage capacitor plate formed above and insulated from said dynamic storage node;

a transfer device formed on said surface of said semiconductor substrate, said transfer device having a drain electrode comprising a diffused bit line, said transfer device selectively coupling data signals between said diffused bit line and said dynamic storage node;

a floating gate electrode formed above and insulated from a portion of said semiconductor substrate between said transfer device and said storage capacitor first and second charge injection means formed on separate regions of said floating gate electrode, said first and second charge injection means being capable of injecting charge into and removing charge from, respectively, said floating gate electrode; and first and second control electrodes disposed on said first and second charge injector means, respectively, said second charge injector means, respectively, said second control electrode comprising a portion of said gate electrode of said transfer device, said first and second control electrodes receiving independent control voltages such that either (a) one of said charge injection means injects charge into said floating gate electrode or (b) the other of said charge injection means removes charge from said floating gate electrode, as a function of a pre-existing charge on said floating gate electrode and the logic state of said dynamic storage node whereby said first and second charge injector means are prohibited from performing either said charge injection or said charge removal when the logic state to be stored said floating gate electrode is the same as the logic state currently stored thereon.

* * * * *